United States Patent
Tao et al.

[19]

[11] Patent Number: 6,156,629
[45] Date of Patent: Dec. 5, 2000

[54] METHOD FOR PATTERNING A POLYSILICON GATE IN DEEP SUBMICRON TECHNOLOGY

[75] Inventors: Hun-Jan Tao; Yuan-Chang Huang, both of Hsin-Chu, Taiwan

[73] Assignee: Taiwan Semiconductor Manufacturing Company, Hsin-Chu, Taiwan

[21] Appl. No.: 09/164,998

[22] Filed: Oct. 1, 1998

[51] Int. Cl.[7] ............................................ H01L 21/26
[52] U.S. Cl. ..................... 438/535; 438/636; 438/689; 438/706; 438/717; 438/725; 438/729; 438/952; 156/643; 156/656; 216/37; 216/42; 216/47; 216/72; 216/79
[58] Field of Search .................... 438/585, 636, 438/689, 717, 725, 729, 706, 952; 156/643, 656; 216/37, 42, 47–67, 72, 79

[56] References Cited

U.S. PATENT DOCUMENTS

| | | | |
|---|---|---|---|
| 5,094,712 | 3/1992 | Becker et al. | 156/643 |
| 5,219,788 | 6/1993 | Abernathey et al. | 437/187 |
| 5,346,586 | 9/1994 | Keller | 156/656 |
| 5,545,588 | 8/1996 | Yoo | 437/187 |
| 5,804,088 | 9/1999 | McKee | 216/47 |
| 5,948,703 | 9/1999 | Shen et al. | 438/714 |
| 5,962,195 | 10/1999 | Yen et al. | 430/316 |

*Primary Examiner*—Tom Thomas
*Assistant Examiner*—Nitin Parekh
*Attorney, Agent, or Firm*—George O. Saile; Stephen B. Ackerman; William J. Stoffel

[57] ABSTRACT

A method of etching polysilicon using an oxide hard mask using a three step etch process. Steps one and two are performed insitu in a high density plasma (e.g., TCP— transformer coupled plasma) oxide etcher. Step 3, the polysilicon etch is performed in a different etcher (e.g., poly RIE etcher). A multi-layered semiconductor structure 35 (FIG. 1) is formed comprising: a substrate 10, a gate oxide layer 14, a polysilicon layer 18, a hard mask layer 22, and a bottom anti-reflective coating (BARC) layer 26 and a resist layer 30.

a) in STEP 1, etching the bottom anti-reflective coating (BARC) layer and the hard mask layer by flowing fluorocarbon gas species gas and argon gas, and applying a first TCP Power and a first Bias power;

b) in STEP 2, stripping the bottom anti-reflective coating (BARC) layer by flowing a oxygen; and applying a second TCP Power and second Bias power;

c) Placing the substrate into a polysilicon high density plasma etcher and performing the following step: in STEP 3—etching the polysilicon layer by flowing chlorine species, oxygen species; Helium species and bromine gas species and applying a third TCP Power and a third Bias power.

15 Claims, 2 Drawing Sheets

METHOD FOR PATTERNING A POLYSILICON GATE IN DEEP SUBMICRON TECHNOLOGY

BACKGROUND OF INVENTION

1) Field of the Invention

This invention relates generally to fabrication of polysilicon gates in a semiconductor device and more particularly to the etching of a bottom anti-reflective coating (BARC) layer and an oxide layer and a polysilicon layer in a high density plasma oxide etcher.

2) Description of the Prior Art

In general, integrated circuits are formed by patterning regions on a substrate and the by patterning layers formed on the substrate. As an example, a substrate is typically formed with an oxide layer, such as silicon dioxide. This oxide layer may function as a gate oxide to the active devices formed on the substrate. In addition this oxide layer may function as the dielectric layer for capacitors formed on the substrate. Other film layers may be formed or deposited on the gate oxide. As an example, polysilicon may be deposited on the gate oxide layer as a surface conduction layer. Other films in turn, may be deposited on the polysilicon layer. These various film layers must be patterned and etched to the gate oxide. The technique of photolithography is frequently used to pattern and etch these different film layers. Typically this involves coating the wafer with a photoresist. The photoresist is then exposed with ultraviolet radiation through a mask. A desired pattern is thus imaged on the photoresist to form a photoresist mask. The photoresist mask includes exposed areas that allow an underlying film to be etched using wet or dry etching processes. The etch depth or endpoint must be closely controlled to insure that an underlying layer (i.e. gate oxide) is not also etched through. For etching the small dry features required for high density application, Dry etch processes are typically utilized. With dry etching, gasses are the primary etch medium. Plasma dry etching uses plasma energy to drive the reaction.

As the industry moves towards higher density applications, the gate oxides used for the active devices of a semiconductor have tended to become thinner. Such thin gate oxides require etching techniques and etchants that are highly selective to the gate oxide are is then a need in the industry for better methods for patterning and etching the layers of a semiconductor structure, particularly polysilicon which have been formed on a thin gate oxide.

It is known in the industry that in a plasma dry etch process, the etch selectivity to a gate oxide can be more easily achieved when there is no photoresist present during the polysilicon to gate oxide etch step. Accordingly, in a representative prior art process sequence for etching a semiconductor structure that includes a gate oxide, another oxide layer is first deposited over the semiconductor structure. A layer of photoresist in then deposited on the oxide layer. An oxide hard mask is formed to the polysilicon layer by etching the oxide layer through the photoresist mask. For stripping the photoresist, the wafer is transferred to a photoresist strip chamber. With the photoresist removed, the wafer is transferred to a poly etch chamber to etch the polysilicon layer to the gate oxide.

The transfer of the wafer during the different etch steps tends to introduce contaminants during this process. In particular, exposure of the wafers to ambient may introduce contaminates. Additionally, each different process chamber may introduce contaminants. Moreover, process parameters are difficult to control with physical transfer of the wafers between these different process stations. Finally, the operation of these different process stations is time consuming and adds to production costs.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,545,558(Yoo) shows a method of etching a gate by etching 1) ARC hard mask, 2) SOG and 3) poly.

U.S. Pat. No. 5,219,788(Abernathey) *Bilayer metallization cap for photolithography*—shows a process of patterning a conductive layer. The first layer is an antireflective coating such as titanium nitride applied to the metal. The second layer is a barrier comprising silicon such as sputtered silicon or SiO2.

U.S. Pat. No. 5,346,586(Keller) *Method for selectively etching polysilicon to gate oxide using an insitu ozone photoresist strip*—The method is performed insitu in a plasma etch chamber. Initially, an oxide hard mask is formed on the semiconductor structure by etching a deposited oxide layer through a photoresist mask. The photoresist mask is then stripped in the same etch chamber using a high pressure ozone plasma. With the photoresist mask stripped from the semiconductor structure, The polysilicon layer can be etched through the oxide hard mask to the gate oxide with a high etch selectivity.

U.S. Pat. No. 5,094,712(Becker) *One chamber in-situ etch process for oxide and conductive material*—shows a method to anisotropically etch an oxide/silicide/poly sandwich structure on a silicon wafer substrate.

However, further improvements are necessary.

SUMMARY OF THE INVENTION

It is an object of the present invention to provide a method for fabrication a submicron polysilicon gate.

It is an object of the present invention to provide a method for stripping a photoresist layer and etching through a polysilicon layer to a gate oxide.

It is a further object of the present invention to provide a method for etching through a polysilicon layer to a gate oxide that can be performed insitu so that contamination can be eliminated.

It is another object of the present invention to provide a method of plasma dry etching a polysilicon layer to a gate oxide which is relatively inexpensive and adaptable to large scale semiconductor manufacture.

It is an object of the present invention to provide a method for forming a hardmask for about 0.25 μm and 0.18 μm dimensions using a DUV Resist 30/organic BARC 26/oxide hard mask 22/poly or amorphous silicon 18/Gate oxide structure 35.

It is an object of the present invention to provide a three step etch process where the first two etch steps ((a) oxide hardmask etch and (b) BARC/photoresist strip are performed insitu a high density plasma (HDP) oxide etcher and the third step (etch polysilicon) is performed in a poly etcher.

The invention improves the formation of submicron gates by providing a insitu PR/BARC removal process with biased $O_2$ plasma to avoid BARC residue.

To accomplish the above objectives, the present invention provides a method of etching polysilicon using an oxide hard mask. The invention has a three step etch process. Steps one and two are performed insitu in a high density plasma (HPD) oxide (e.g., TCP—transformer coupled plasma) etcher. A multi-layered semiconductor structure 35 (FIG. 1) is formed comprising: a substrate 10, a gate oxide layer 14, a polysilicon layer 18, a hard mask layer 22, and a bottom anti-reflective coating (BARC) layer 26 and a resist layer 30.

The polysilicon layer is now etched in the invention's 3 step etch. The 3 step is summarized as follows:

| ETCH STEP | ETCHER TYPE | Gasses | Parameters |
|---|---|---|---|
| 1 - etch BARC and Hard MASK | OXIDE HDP | $C_2F_6$, $O_2$ & Ar | Source and Bias power |
| 2 Remove BARC | OXIDE HDP | $O_2$ | Source and Bias power |
| 3 Etch Polysilicon | Polysilicon HDP | $HeO_2$, $Cl_2$, HBr | Source and Bias power |

The inventions 3 step etch comprises:

① Step 1—(FIG. 2)—etches the BARC 26 and hard mask layer 22 in a high density plasma (HDP) etcher (Transformer coupled plasma) etch at a low pressure between 5 and 50 mtorr, and separate bias and source power, with a carbon fluoride gas (CxFxH3), an Ar gas and possibly 0 to 10 sccm of $O_2$.

② Step 2—(FIG. 3) removes insitu BARC 26 and resist layer 30 insitu in the high density plasma (HDP) oxide etcher. Step 2 removes the BARC layer 26 and the resist layer 30 by an etch using an $O_2$ plasma at a bias power and separate control of TCP power and bias power.

③ Step 3 (FIG. 4) etches, in a polysilicon etcher, the polysilicon layer 18 to from a submicron polysilicon gate.

Benefits

The present invention provide a method of forming a hardmask for 0.25 and 0.18 μm dimensions. The invention uses a DUV Resist 30/organic BARC 26/oxide hard mask 22/poly or amorphous silicon 18/Gate oxide structure 35. See FIG. 1. The invention has a ① BARC 26/oxide hard mask 22 etch in a high density plasma oxide etcher followed by ② Step 2 etch—an insitu PR/BARC strip. This is followed by a ③ polysilicon etch in a polysilicon etcher using the oxide hard mask to from a polysilicon gate 18.

The invention improves the formation of submicron gates by providing:

Oxide hardmask etch by high density plasma etch for better critical dimension (CD) control.
(The invention's HDP etch yields superior CD because the RIE etches can not separately control source and bias power thereby can not achieve adequate CD control).

hardmask open by an etch with high oxide to silicon selectivity so as to avoid micro-trench during mask open.

The etcher is capable to run insitu PR/BARC removal with biased $O_2$ plasma to avoid BARC residue.

The etch for hardmask open can run at low pressure (<50 mtorr) to ensure the tight CD control.

The invention provides the following advantages 2 step—1 etcher process for BARC/oxide etch and PR/BARC removal less BARC residue tight CD control less gate oxide micro-trench concern Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a three step etch method of forming a submicron polysilicon gate.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

Figure 1:
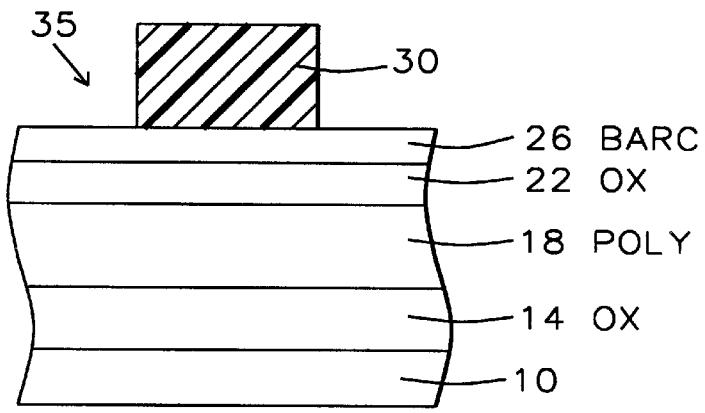
FIGS. 1, 2, 3, and 4 are cross sectional views for illustrating a method for forming a submicron polysilicon gate according to the present invention.

A. FIG. 1—Form a Gate Oxide Layer 14, a Polysilicon Layer 18, a Hard Mask Layer 22 and a Bottom Anti-Reflective Coating (BARC) Layer 26

FIG. 1 shows a structure 35 produced by the sequential forming a gate oxide layer 14, a polysilicon layer 18, a hard mask layer 22, and a bottom anti-reflective coating (BARC) layer 26 over a substrate 10. Below is a table is an overview of some embodiments in the drawings.

TABLE

| Element No. | generic name | preferred examples | Preferred Parameters (thickness, doping, etc.) | Other alternate examples |
|---|---|---|---|---|
| 14 | gate oxide layer | oxide | Thickness = 20 to 100 Å | nitrided oxide |
| 20 | polysilicon layer | Polysilicon or amorphous silicon | Th = 1000 to 3000Å | $WSi_x$ = doped or undoped over polysilicon |
| 22 | a hard mask layer | Oxide | 200 to 3000 Å | nitride or oxynitride |
| 26 | bottom anti-reflective coating (BARC) layer | organic | Th = 500 to 2000 Å | |
| 30 | resist layer | DUV photoresist | 6000 to 13000 Å | i-line |

Substrate 10 is understood to possibly include a semiconductor wafer, active and passive devices formed within the wafer and layers formed on the wafer surface.

The gate oxide layer 14 is preferably composed of silicon oxide.

The polysilicon layer can is a poly-crystalline or amorphous layer of silicon that is deposited on the gate oxide 14. The polysilicon layer can be uses as a silicon gate or can be used for interconnecting interconnections between devices.

The polysilicon layer can include a top $WSi_x$ or other refractory metal layer.

The hard mask layer 22 is preferably composed of silicon oxide, silicon nitride (SiN) or Silicon oxynitride (SiON) or a composite of oxide/nitride/oxide; and most preferably composed of silicon oxide. The hard mask layer 22 preferably has a thickness in a range of between about 200 and 3000 Å.

The bottom anti-reflective coating (BARC) layer is preferably composed of polymer resin with photo compounds, organic BARC or inorganic BARC.

B. FIG. 1—Forming a Resist Layer 30

Still referring to FIG. 1, a resist layer 30 is formed over the bottom anti-reflective coating (BARC) layer 26. The resist layer 30 defines the polysilicon gate. As shown in FIG. 1, the photoresist layer 30 is exposed and developed to form a pattern that defines the polysilicon gate and other structures. The resist layer is preferably composed of a DUV positive photoresist, such as IBM APEX resist, IBM's KRS, Hoechst Ax's DX-46, OCG's ARCH, _Shinetsu, Tok, AZ or JSR resists. The resist preferably has a thickness in a range of between about 6000 and 15000 Å and a width in a range of between about 0.14 μm and 0.30 μm and a width more preferably between about 0.15 μm and 0.25 μm.

C. Summary of Key Steps of the Insitu Etch

Figure 2:
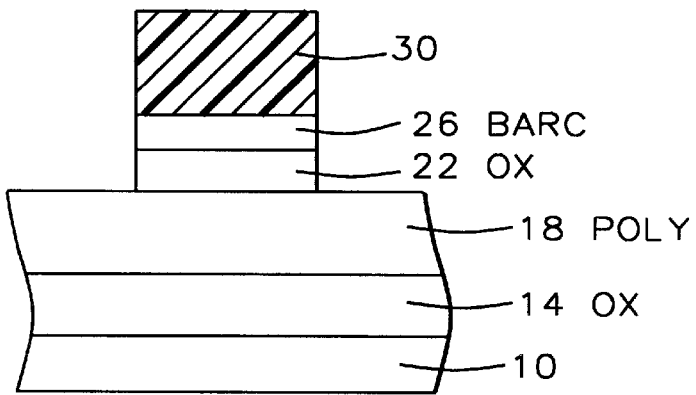
Figure 3:
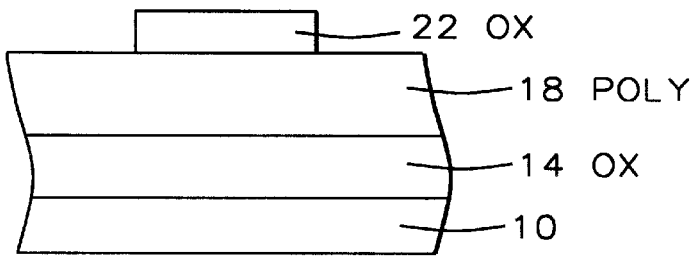

FIGS. 2 and 3 show key steps in the invention. The invention has a total of 3 etch steps. The first step is a BARC 26/oxide hard mask 22 etch in a high density plasma etcher. The second step is an insitu PR/BARC strip. Steps 1 and 2 are performed insitu a HPD reactor. The third step is a polysilicon 18 etch in a different etcher (e.g., polysilicon RIE etcher) using the oxide hard mask to from a polysilicon gate.

Important parameters for the first two steps are shown in the table below:

TABLE

| Important parameters for the first two etch steps | |
|---|---|
| Step 1 - FIG. 2 - etch BARC and hard mask layer 22 | etching said BARC layer 26 and said hard mask layer 22 a high density plasma (HDP) etcher using a high density plasma (HDP) (Transformer coupled plasma) etch at a<br>☐ low pressure between 5 and 50 mtorr,<br>☐ separate bias and source power<br>☐ a bias power in a range of between about 500 and 1500 W and a source power in a range of between about 500 and 1500 w<br>☐ a carbon fluoride gas ($C_xF_xH_y$) in a range of between about 10 and 50 sccm,<br>☐ a Ar gas flow in a range of between about 50 and 500 sccm (tgt 150 sccm) and (possible 0 to 10 sccm of $O_2$), |
| step 2 - FIG. 3 - remove insitu BARC 26 and resist layer 30 | removing said BARC layer 26 and said resist layer 30 insitu in said high density plasma (HDP) etcher; the removal of said BARC layer 26 and said resist layer 30 by an etch using an<br>☐ $O_2$ plasma at a bias power in a range of between about 100 and 300 W; and a source power between 500 and 2000 W;<br>☐ and separate control of TCP and bias power;<br>● It is critical to have separate source and bias controls to achieve the correct bottom anti-reflective coating (BARC) layer and poly layer profiles.<br>● The TCP source power control: will change the photoresist strip rate.<br>● The Bias power will impact on the BARC removal capability and the final hardmask profile. If the bias power is too high the hardmask to will be rounded. |

D. Type of Reactor and Etch

As defined in this patent and industry standards a high density plasma (HDP) reactor is a reactor that operates at a ion density greater than 1E11 ions/cc. The HDP reactor must also have the capability to operate at a low pressure (>50 mtorr) at high density (>1E11).

The following are examples of oxide (HDP) high density plasma etch tools: model TCP 9100 manufactured by LAM (oxide ether), HDP 5300 by AMAT and IPS by AMAT. HDP oxide etchers are distinct from HDP polysilicon etchers in their reactor design/configurations and chemistry. Oxide etches require more physical bombardment than polysilicon. An oxide etcher is designed to operate at a higher bias power than a polysilicon etcher. A polysilicon HPD etcher can not be used for the invention's steps 1 and 2. A polysilicon etcher can't run in-situ photoresist removal and can't intensively use $C_xF_y$ gasses.

E. FIG. 2—Step 1—Etching the BARC Layer 26 and the Hard Mask Layer 22 a High Density Plasma (HDP) Etcher FIG. 2 shows the first step of etching of the BARC layer 26 and the hard mask layer 22 a high density plasma (HDP)(>1E11 ions/cc) etcher. This step is a novel etch step that provides unexpected good critical dimension (CD) uniformity. The resist layer is used as an etch mask. The etch is performed using a high density plasma (e.g., Transformer coupled plasma., TCP9100 or HDP 5300 oxide HDP etcher) etcher (not a diode RIE etcher).

TABLE

ETCH STEP 1 = etch the BARC layer 26 and Hard mask layer 22

|  | UNITS | LOW | TGT | HIGH |
|---|---|---|---|---|
| Process type-HPD Plasma etch in an oxide etcher |  |  |  |  |
| Carbon Fluorine (e.g., $C_2F_6$) flow | sccm | 10 | 25 | 50 |
| $O_2$ flow | sccm | 0 | optional | 10 |
| etch gasses | SCCM | 50 | 300 | 500 |
| Argon ration of Carbon Fluorine to Ar e.g., ($C_2F_6$:Ar) | 1:2 | 10:1 | 1:20 |  |
| pressure | mtorr | 5 | 30 | 50 |
| temperature of wafer | C° | 50 | 70 | 110 |
| Source | W | 500 | 800 | 1500 |
| Bias | W | 500 | 800 | 1500 |

The etch is performed at a low pressure between 5 and 50 mtorr, a bias power in a range of between about 500 and 1500 W; and a source power in a range of between about 500 and 1500 W; a carbon fluoride gas ($C_xF_yH_z$ (preferably $C_2F_6$, $CH_2F_2$, $CHF_3$ or $C_2HF_5$ and most preferably $C_2F_6$)) in a range of between about 10 and 50 sccm, a Ar gas flow in a range of between about 50 and 500 sccm (tgt 300 sccm) and (possibly 0 to 10 sccm of $O_2$). The above flows can be converted into mole ratios for use in other etchers with different chamber sizes and wafer sizes.

In addition, CO or $N_2$ gasses may also be flowed.

The etch performed with a separate source and bias control. It is critical to have separate source and bias controls to achieve the correct bottom anti-reflective coating (BARC) layer and poly layer profiles.

The TCP source power control: will change the photoresist strip rate.

The Bias power will impact on the BARC removal capability and the final hardmask profile. If the bias power is too high the hardmask top will be rounded.

Figure 5:
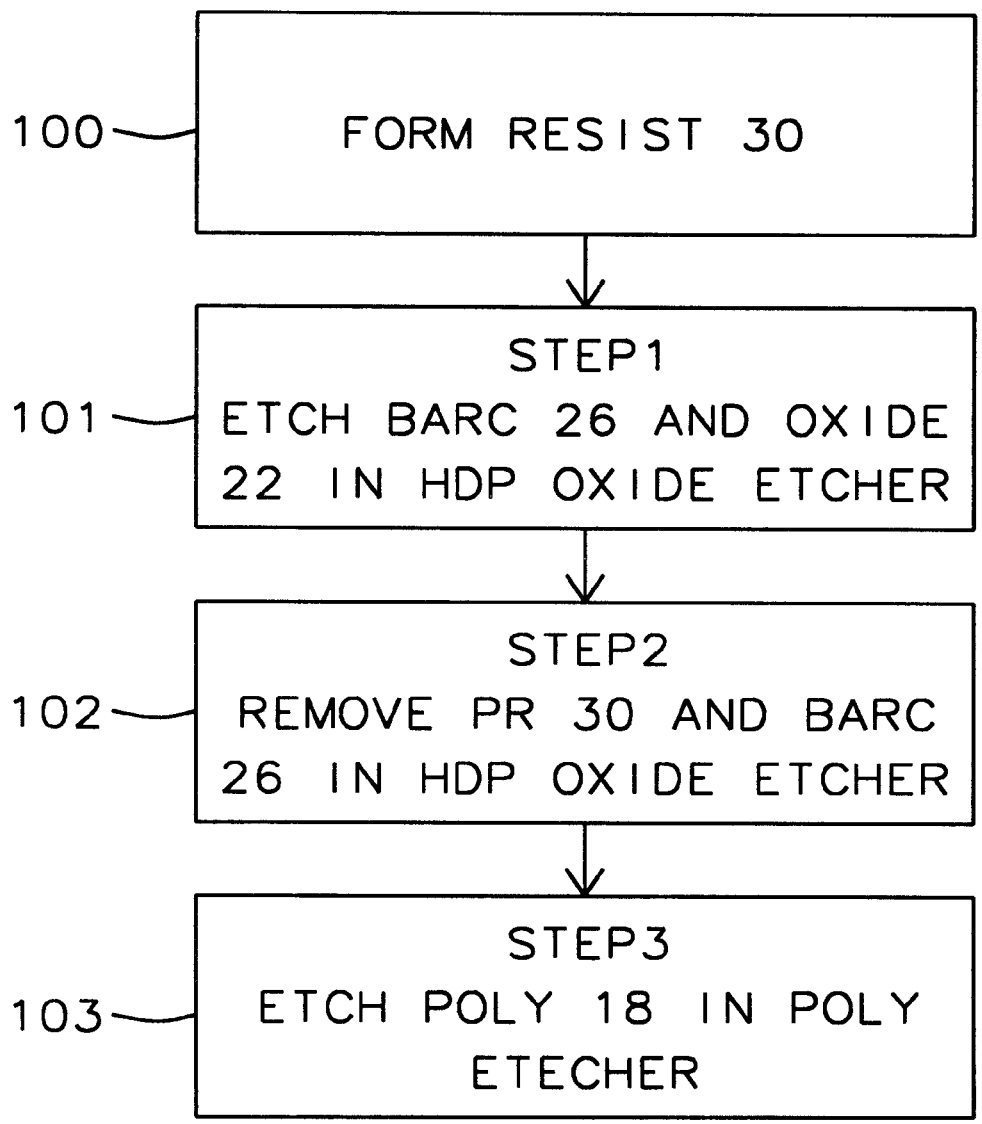
FIG. 5 is a flow chart showing steps 100, 101, 102 and 103 for illustrating a method for forming a submicron polysilicon gate according to the present invention.

F. FIG. 3—Step 2—Removing the BARC Layer 26 and the Resist Layer 30 Insitu in the High Density FIG. 3 shows step 2, (FIG. 5, 102) removing of the BARC layer 26 and the resist layer 30 insitu in the high density plasma (HDP) oxide etcher. BARC is difficult to remove with out bias power. Thus bias power (biased $O_2$ plasma) is required to strip the BARC (insitu). Sometimes it is necessary to add a small amount of $C_2F_6$ to enhance the BARC stripping.

The removal of the BARC layer 26 and the resist layer 30 is performed by an etch using an $O_2$ plasma at a bias power in a range of between about 100 and 300 W. This bias power is critical to removing the BARC layer 26.

The Invention's etch STEP 2 is not a conventional $O_2$ plasma photoresist strip because the strip is performed at a bias between about 100 and 300 W and Transformer coupled plasma (TCP) between 500 and 2000 W.

The table below summaries the preferred Etch parameters for the etch STEP 2.

TABLE

ETCH STEP 2 - preferred Etch parameters

|  | UNITS | LOW | TGT | HIGH |
|---|---|---|---|---|
| Process type-$O_2$ Plasma etch in Oxide HDP etcher. |  |  |  |  |
| $O_2$ etch gasses | sccm | 500 | 1000 | 2000 |
| Optional $C_2F_6$ etch gasses | SCCM | 0 | 10 | 50 |
| pressure | mtorr | 10 | 300 | 500 |
| temperature |  | 50 | 70 | 110 |
| Source |  | 500 | 1000 | 2000 |
| Bias |  | 100 | 200 | 300 |

G. STEP 3—FIG. 4—Etching the Polysilicon Layer 18

Figure 4:
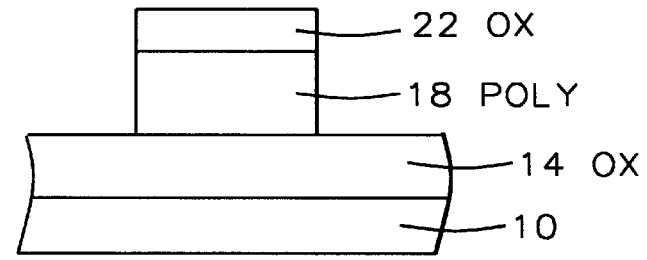

FIG. 4 (FIG. 5, STEP 3) shows the third etch step—etching the polysilicon layer 18 in a polysilicon HDP etcher using the hard mask layer 22 as an etch mask thereby forming the polysilicon gate 18. An example of a polysilicon HDP (TCP) reactors that can be used is a model TCP9400 by LAM.

The table below shows a preferred polysilicon etch that can be used in the invention's etch process.

TABLE

ETCH STEP 3 - preferred polysilicon etch parameters

|  | units | Low | tgt | hi |
|---|---|---|---|---|
| Process type HDP polysilicon etch. |  |  |  |  |
| $HeO_2$ etch gas (ratio He:$O_2$ = 70% He + 30% $O_2$) | sccm | 0 | 5 | 20 |
| cl2 etch gasses | SCCM | 30 | 50 | 100 |
| HBr | SCCM | 50 | 200 | 400 |
| pressure | torr | 10 | 20 | 30 |
| wafer temperature | C° | 30 | 70 | 110 |

The key feature of this novel etch step is the low pressure preferably between about 15 and 25 mtorr (tgt=20 mtorr).

The invention's etch process can produce polysilicon gates 18 having a critical dimension (width) in a range of between about 0.14 and 0.30 μm and more preferably between 0.14 and 0.25 μm.

What is claimed is:

1. A method of fabrication of a polysilicon gate; comprising the steps of:

forming sequentially a gate oxide layer, a polysilicon layer, a hard mask layer composed of silicon oxide, and a bottom anti-reflective coating (BARC) layer over a substrate;

forming a resist layer over said bottom anti-reflective coating (BARC) layer; said resist layer defining said polysilicon gate;

placing said substrate into an oxide high density plasma etcher and performing the following steps:

a) in STEP 1, etching said bottom anti-reflective coating (BARC) layer and said hard mask layer by flowing fluorocarbon gas species and argon gas, and applying a first TCP Power and a first Bias power; step 1 further comprises the following conditions: a $C_2F_6$ flow between 10 and 50 sccm; a $O_2$ flow between 0 and 10 sccm; an Argon flow between 50 and 500 sccm; a ratio of Carbon Fluorine to Ar ($C_2F_6$:Ar) between about 1:2 and 1:20; a pressure between about 5 and 50 mtorr; a temperature of wafer between 50 and 110° C.; a Source power between 500 and 1500 W; a Bias power between 500 and 1500 W;

b) in STEP 2, stripping said bottom anti-reflective coating (BARC) layer by flowing oxygen; and applying a second TCP Power and second Bias power;

placing said substrate into a polysilicon high density plasma etcher and performing the following step:

c) in STEP 3—etching said polysilicon layer by flowing chlorine species, oxygen species; Helium species and bromine gas species and applying a third TCP Power and a third Bias power.

2. The method of claim 1 wherein step 2 further comprises the following conditions: a $O_2$ flow between about 500 and 2000 sccm; at a pressure between 10 and 500 mtorr; at a wafer temperature between 50 and 110° C.; and a Source power between 500 and 2000 w; and a Bias between 100 and 300 W.

3. A method of fabrication of a polysilicon gate; comprising the steps of:

forming sequentially a gate oxide layer, a polysilicon layer, a hard mask layer composed of silicon oxide, and a bottom anti-reflective coating (BARC) layer over a substrate;

forming a resist layer over said bottom anti-reflective coating (BARC) layer; said resist layer defining said polysilicon gate;

placing said substrate into an oxide high density plasma etcher and performing the following steps:

a) in STEP 1, etching said bottom anti-reflective coating (BARC) layer and said hard mask layer by flowing fluorocarbon gas species and argon gas, and applying a first TCP Power and a first Bias power;

b) in STEP 2, stripping said bottom anti-reflective coating (BARC) layer by flowing oxygen; and applying a second TCP Power and second Bias power;

placing said substrate into a polysilicon high density plasma etcher and performing the following step:

c) in STEP 3—etching said polysilicon layer by flowing chlorine species, oxygen species; Helium species and bromine gas species and applying a third TCP Power and a third Bias power; and step 3 further comprises the following conditions: a $HeO_2$ flow between 0 and 20 sccm; a $Cl_2$ flow between 30 and 100 SCCM; a HBr flow between 50 and 400 SCCM; at a pressure between 10 and 30 torr; at a wafer temperature ° C. between 30 and 110° C.

4. The method of claim 1 wherein said gate oxide layer composed of silicon oxide having a thickness in a range of between about 20 and 100 Å.

5. The method of claim 1 wherein said polysilicon layer having a thickness in a range of between about 1000 and 3000 Å.

6. The method of claim 1 wherein said hard mask layer composed of a material selected from the group consisting of silicon nitride, oxynitride; and silicon oxide and having a thickness in a range of between about 200 and 3000 Å.

7. The method of claim 1 wherein said hard mask layer composed of a material selected from the group consisting of silicon oxide and having a thickness in a range of between about 200 and 3000 Å.

8. The method of claim 1 wherein said bottom anti-reflective coating (BARC) layer composed of polymer resin with photo compounds.

9. The method of claim 1 wherein said resist layer having a thickness in a range of between about 6000 and 13000 Å and a width in a range of between about 0.14 $\mu$m and 0.25 $\mu$m.

10. A method of fabrication of a polysilicon gate; comprising the steps of:

forming sequentially a gate oxide layer, a polysilicon layer, a hard mask layer composed of silicon oxide, and a bottom anti-reflective coating (BARC) layer over a substrate;

forming a resist layer over said bottom anti-reflective coating (BARC) layer; said resist layer defining said polysilicon gate;

placing said substrate into an oxide high density plasma etcher and performing the following steps:

a) in STEP 1, etching said bottom anti-reflective coating (BARC) layer and said hard mask layer by flowing fluorocarbon gas species gas and argon gas, and applying a first TCP Power and a first Bias power;

(1) step 1 further comprises the following conditions: a $C_2F_6$ flow between 10 and 50 sccm; a $O_2$ flow between 0 and 10 sccm; an Argon flow between 50 and 500 sccm; a ratio of Carbon Fluorine to Ar ($C_2F_6$:Ar) between about 1:2 and 1:20; a pressure between about 5 and 50 mtorr; a temperature of wafer between 50 and 110° C.; a Source power between 500 and 1500 W; a Bias power between 500 and 1500 W;

b) in STEP 2, stripping said bottom anti-reflective coating (BARC) layer by flowing oxygen; and applying a second TCP Power and second Bias power;

(1) step 2 further comprises the following conditions: a $O_2$ flow between about 500 and 2000 sccm; at a pressure between 10 and 500 mtorr; at a wafer temperature between 50 and 110° C.; and a Source power between 500 and 2000 w; and a Bias between 100 and 300 W;

placing said substrate into a polysilicon high density plasma etcher and performing the following step:
  c) in STEP 3—etching said polysilicon layer by flowing chlorine species, oxygen species; Helium species and bromine gas species and applying a third TCP Power and a third Bias power;
    (1) step 3 further comprises the following conditions: a $HeO_2$ flow between 0 and 20 sccm; a $Cl_2$ flow between 30 and 100 SCCM; a HBr flow between 50 and 400 SCCM; at a pressure between 10 and 30 torr; at a wafer temperature ° C. between 30 and 110° C.

11. The method of claim 10 wherein said hard mask layer composed of a material selected from the group consisting of silicon nitride, oxynitride; and silicon oxide and having a thickness in a range of between about 200 and 3000 Å.

12. The method of claim 10 wherein said hard mask layer composed of a material selected from the group consisting of silicon oxide and having a thickness in a range of between about 200 and 3000 Å.

13. The method of claim 10 wherein said bottom anti-reflective coating (BARC) layer composed of polymer resin with photo compounds.

14. The method of claim 10 wherein said resist layer having a thickness in a range of between about 6000 and 13000 Å and a width in a range of between about 0.14 μm and 0.25 μm.

15. A method of fabrication of a polysilicon gate; comprising the steps of:

forming sequentially a gate oxide layer, a polysilicon layer, a hard mask layer composed of silicon oxide, and a bottom anti-reflective coating (BARC) layer over a substrate;

forming a resist layer over said bottom anti-reflective coating (BARC) layer; said resist layer defining said polysilicon gate;

placing said substrate into an oxide high density plasma etcher and performing the following steps:
  a) in STEP 1, etching said bottom anti-reflective coating (BARC) layer and said hard mask layer by flowing fluorocarbon gas species and argon gas, and applying a first TCP Power and a first Bias power;
  b) in STEP 2, stripping said bottom anti-reflective coating (BARC) layer by flowing oxygen; and applying a second TCP Power and second Bias power;

placing said substrate into a polysilicon high density plasma etcher and performing the following step:
  c) in STEP 3—etching said polysilicon layer by flowing chlorine species, oxygen species; Helium species and bromine gas species and applying a third TCP Power and a third Bias power;
    step 3 comprises the following conditions: a $HeO_2$ flow between 0 and 20 sccm; a $Cl_2$ flow between 30 and 100 SCCM; a HBr flow between 50 and 400 SCCM; at a pressure between 10 and 30 torr; at a wafer temperature ° C. between 30 and 110° C.

* * * * *